United States Patent
Ferrario et al.

(10) Patent No.: US 9,208,835 B2
(45) Date of Patent: Dec. 8, 2015

(54) TIMING VIOLATION HANDLING IN A SYNCHRONOUS INTERFACE MEMORY

(75) Inventors: Marco Ferrario, Milan (IT); Christophe Vincent Antoine Laurent, Agrate Brianza (IT); Francesco Mastroianni, Melzo (IT)

(73) Assignee: Micron Technology, Inc., Boise, ID (US)

( * ) Notice: Subject to any disclaimer, the term of this patent is extended or adjusted under 35 U.S.C. 154(b) by 343 days.

(21) Appl. No.: 13/518,371

(22) PCT Filed: Dec. 29, 2009

(86) PCT No.: PCT/IT2009/000585
§ 371 (c)(1),
(2), (4) Date: Dec. 11, 2012

(87) PCT Pub. No.: WO2011/080771
PCT Pub. Date: Jul. 7, 2011

(65) Prior Publication Data
US 2013/0077393 A1    Mar. 28, 2013

(51) Int. Cl.
| | | |
|---|---|---|
| G11C 7/10 | (2006.01) | |
| G11C 7/22 | (2006.01) | |
| G11C 8/18 | (2006.01) | |
| G11C 13/00 | (2006.01) | |
| G11C 11/21 | (2006.01) | |
| G06F 12/08 | (2006.01) | |

(52) U.S. Cl.
CPC ............ *G11C 7/1006* (2013.01); *G11C 7/1051* (2013.01); *G11C 7/22* (2013.01); *G11C 8/18* (2013.01); *G11C 11/21* (2013.01); *G11C 13/0004* (2013.01); *G11C 13/0061* (2013.01); *G06F 12/0802* (2013.01)

(58) Field of Classification Search
CPC ............. G11C 13/0004; G11C 13/004; G11C 11/5678; G11C 7/10006; H01L 45/06; G06F 12/0802
USPC ......... 365/189.04, 230.03, 163; 711/100, 103
See application file for complete search history.

(56) References Cited

U.S. PATENT DOCUMENTS

| | | |
|---|---|---|
| 2002/0110038 A1 | 8/2002 | Harrand et al. |
| 2005/0204091 A1 | 9/2005 | Kilbuck et al. |
| 2006/0190672 A1 | 8/2006 | Fuji |
| 2008/0123391 A1 | 5/2008 | Cho et al. |

OTHER PUBLICATIONS

"International Application Serial No. PCT/IT2009/000585, PCT Search Report mailed Jul. 14, 2010", 3 pgs.

*Primary Examiner* — J. H. Hur
*Assistant Examiner* — Ajay Ojha
(74) *Attorney, Agent, or Firm* — Schwegman Lundberg & Woessner, P.A.

(57) ABSTRACT

A phase-change memory includes a phase to provide an upper row address from a row address buffer, a phase to combine the upper row address with a lower row address to select data for a row data buffer, and a phase to output the data from the row data buffer, where an activate command starts and following activate commands are ignored until a preset time has elapsed.

16 Claims, 3 Drawing Sheets

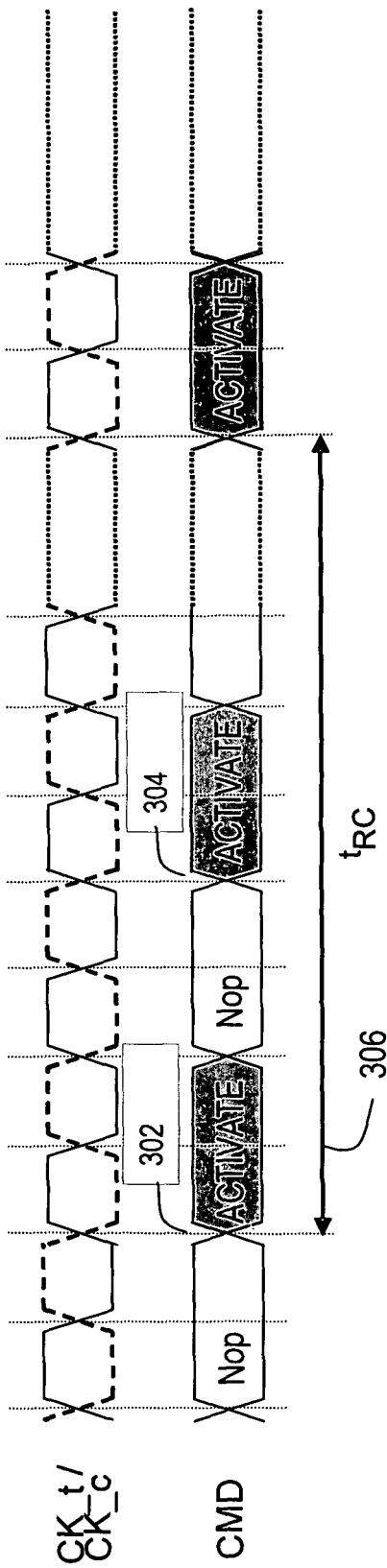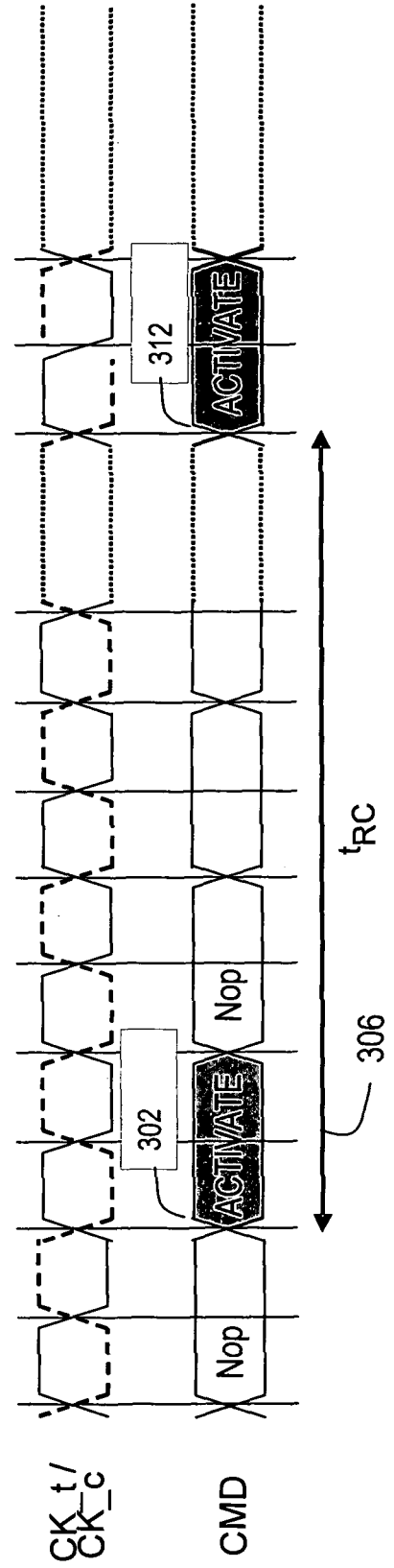

TIMING VIOLATION HANDLING IN A SYNCHRONOUS INTERFACE MEMORY

PRIORITY APPLICATION

This application is a U.S. National Stage Filing under 35 U.S.C. 371 from International Patent Application Serial No. PCT/IT2009/000585, filed 29 Dec. 2009, and published as WO/2011/080771 A1 on 7 Jul. 2011, which is incorporated herein by reference in its entirety.

BACKGROUND OF THE INVENTION

Flash memory has been used to make storage portable among consumer devices but new non-volatile technologies that supplement flash memory are being planned for an increasing number of functions in digital consumer devices. The Phase-Change Memory (PCM) technology is a promising alternative to the current nonvolatile memory mainstream constituted by the Flash technology. PCM provides capabilities that allow system designers to re-evaluate the memory subsystems and continual improvements are needed in these subsystems.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 illustrates a timing problem that may occur when issuing commands for asynchronous operations carried out in a synchronous environment; and FIG. 4 illustrates a timing solution that allows an Activate command to start and ignores following Activate commands until a preset time tRC has elapsed.

Figure 1:
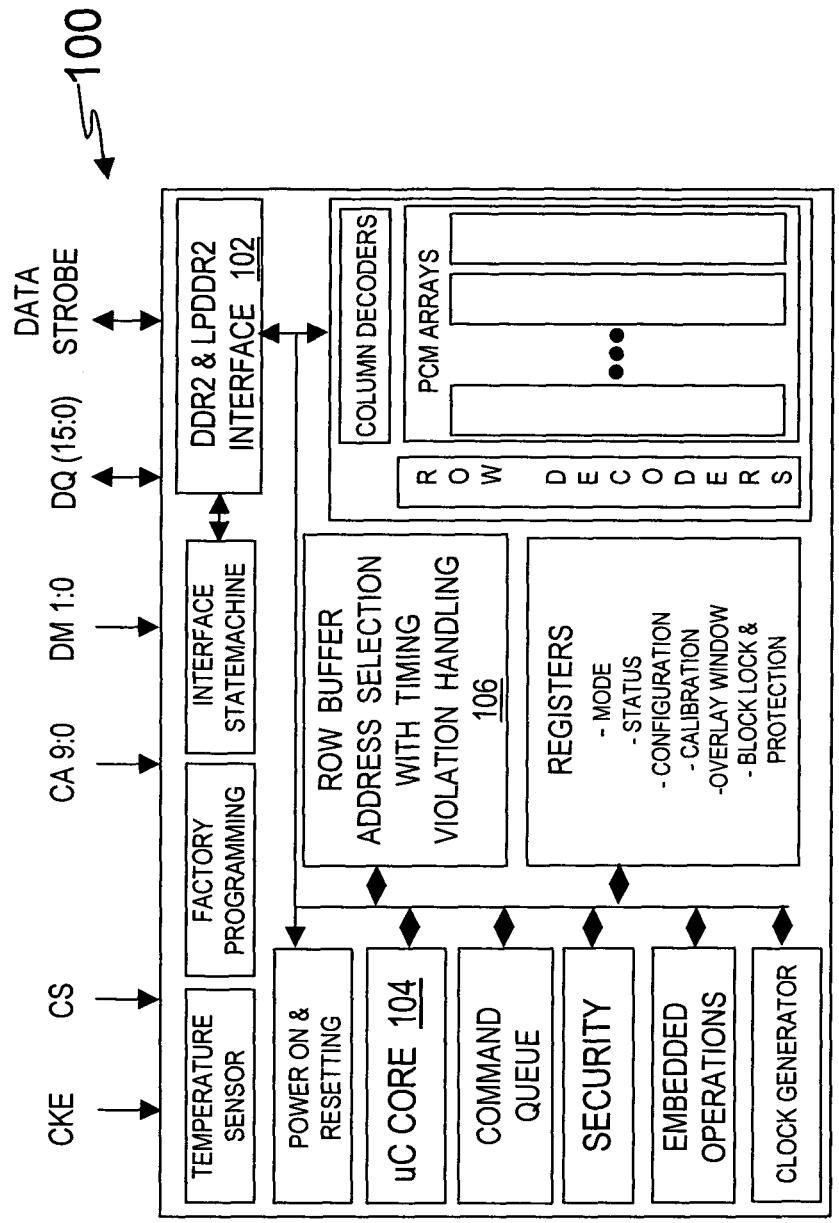
FIG. 1 is exemplary embodiment for a Phase-Change Memory (PCM) with row buffer address selection and timing violation handling.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

FIG. 1 illustrates one exemplary embodiment for a Phase-Change Memory (PCM) device 100 capable of asynchronous operations in a synchronous environment. PCM device 100 includes multiple banks of a PCM array to provide flexibility for splitting the code and data spaces within the memory arrays. The PCM arrays may also be referred to as Phase-Change Random Access Memory (PRAM or PCRAM), Ovonic Unified Memory (OUM) or Chalcogenide Random Access Memory (C-RAM). The arrays of PCM cells include alloys of elements of group VI of the periodic table, elements such as Te or Se that are referred to as chalcogenides or chalcogenic materials.

When the memory arrays use chalcogenides advantageously in phase change memory cells to provide data retention, the data remains stable even after the power is removed from the nonvolatile memory. Taking the phase change material as $Ge_2Sb_2Te_5$ for example, two phases or more are exhibited having distinct electrical characteristics useful for memory storage. The chalcogenide chemistry uses the application of heat to melt the material for the two energy states for any particular bit. It should be noted that the chalcogenic material may be electrically switched between different states intermediate between the amorphous and the crystalline states, thereby giving rise to a multilevel storing capability.

The architecture of memory device 100 illustrated in FIG. 1 shows a multiprocessing interface 102 having a 16-bit data bus (DQ15:0) to allow for communications between a processor and any mixed memory devices that may be attached. High speed communication provided via the bus supports direct writes and provides high speed bus transactions. The signals in the bus may use various signaling methods.

The multiprocessing interface 102 selectively operates at increasingly higher multiples of the fundamental read rate. For example, the interface may provide for a serial input of data, or alternatively, provide a higher bandwidth through a synchronous interface that waits for a clock signal before responding to control inputs (Synchronous Dynamic Random Access Memory (SDRAM)).

Interface 102 may also receive data as a Double-Data-Rate Random Access Memory (DDR RAM) or the next generation DDR2. In DDR2 the bus is clocked at twice the speed of the memory cells so DDR2 can effectively operate at twice the bus speed of DDR. Memory device 100 also supports reduced power interfaces such as Low Power Double-Data-Rate (LPDDR) and LPDDR2 having lower supply voltages.

To control memory operations, memory device 100 includes a microcontroller (uC) core 104 that integrates counters/timers, an interrupt structure, selects modes of power reduction, amongst other processing functions. By way of example, uC 104 along with a Command Queue interprets commands received from the processor and issues memory commands. An internal controller handles the operational timings and verifies the correct execution of the memory commands such as, for example, write commands and read commands. The controller supplies a Status Block whose registers convey information about the status and report on any errors that may occur during memory operations. The status register output may be read to monitor the progress during command operations or report the result of the memory operations.

Figure 2:
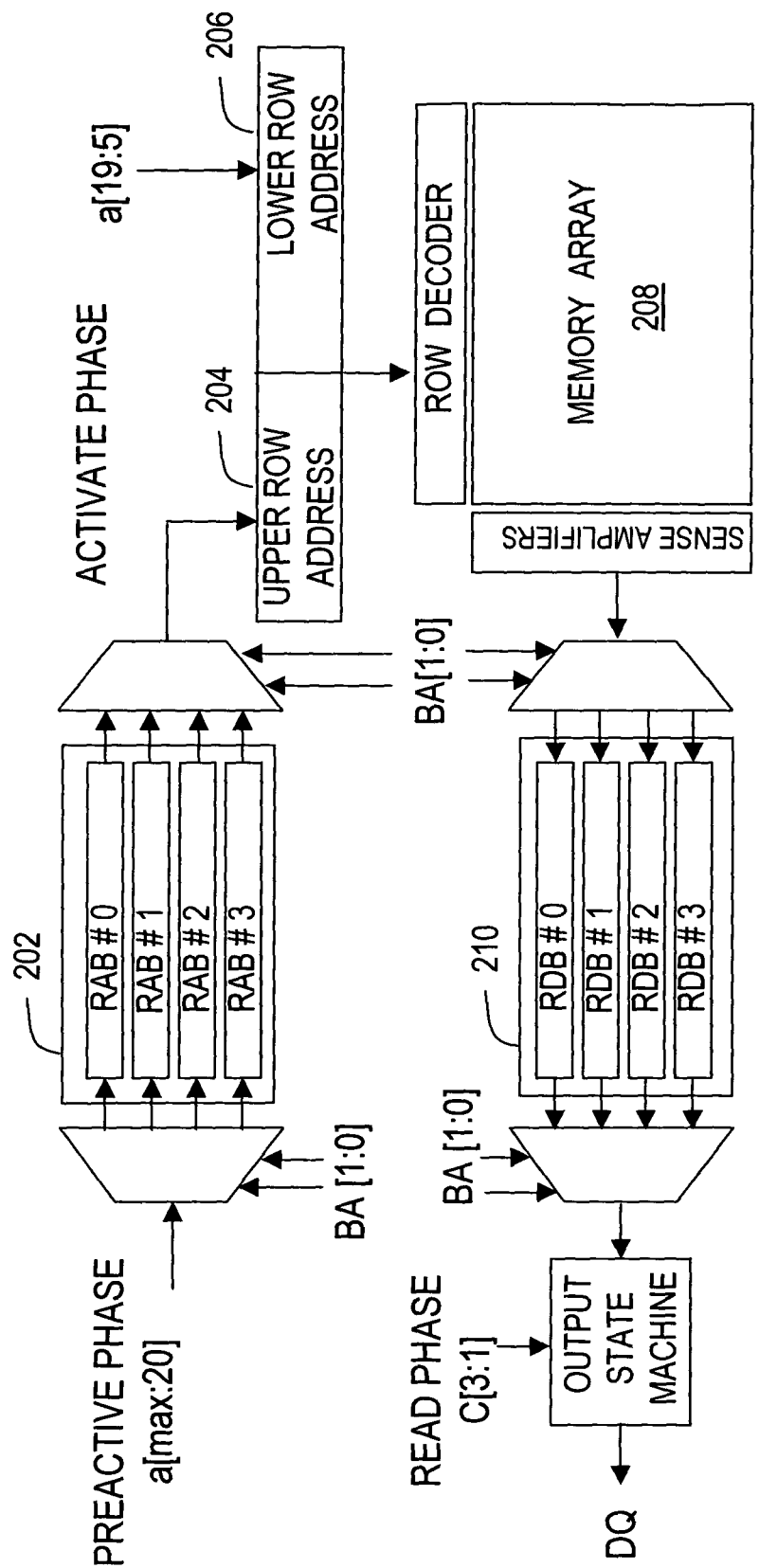
FIG. 2 is a diagram that illustrates providing an array address to the PCM in three phases.

Row Buffer Address Selection 106 delivers an array address to the memory in three phases, the first phase being a PREACTIVE command; the second phase an ACTIVE command; and the third phase a READ or a WRITE command. FIG. 2 illustrates the three phase address read. During the Preactive command, part of a row address is driven on the CA input pins (FIG. 1) and stored in a Row Address Buffer (RAB) 202, where one of RAB #0, RAB #1, RAB #2, or RAB #3 is selected by BA1-BA0. During the Activate command, the first part of the row address is selected from the RAB by BA1-BA0 to provide the UPPER ROW ADDRESS 204. The second portion of the row address is received on the CA input pins (FIG. 1) as LOWER ROW ADDRESS 206. These two portions of the row address are used to select one row from memory array 208. The Activate command allows the internal sensing circuits to transfer that memory content into a Row Data Buffer (RDB) 210 where one of RDB #0, RDB #1, RDB #2, or RDB #3 is selected by BA1-BA0. Each of the four RDB is sized as 32 Bytes.

The {RAB, RDB} pair selected by BA1-BA0 is referred to as a Row Buffer (RB). The BA1-BA0 do not address any portion of the array and select one of the RAB into which the address is placed and/or one of the RDB into which the data is placed. Note that the controller may use any value of BA1-BA0 for any array location.

During the Activate command, any single row of the array may only be opened in one RDB 210 at any point in time. The active RDBs contain data from the different row addresses. During a Read or Write command the BA1-BA0 selects one of the RDB #0, RDB #1, RDB #2, or RDB #3 and the column address on the CA input pins chooses the starting address of the read or write burst for output on the DQ bus.

FIG. 3 illustrates a timing problem that may occur when issuing commands for asynchronous operations carried out in a synchronous environment. The Activate command brings the Row Buffer from an IDLE state to a Row Activating state. The Activate command is applied before any Read or Write operation is executed. The Row Buffer automatically goes from a Row Activating state to the Active state after a time tRCD. As already mentioned, the Activate command is provided with a row address which allows the Memory Array 208 sense amplifiers to initiate an internal read on a defined array area as soon as the command is issued.

The minimum time interval between successive Activate commands to the same Row Buffer pair is labeled tRC 306 in the figure. However, the minimum time interval between Activate commands to different Row Buffer pairs is tRRD, a time that differs from the timing tRC. The figure shows a timing violation that can occur when at least one Activate command 304 is issued to the memory before the time defined by the tRC parameter 306 has elapsed from the previous Activate command 302.

FIG. 4 illustrates a timing constraint implemented by memory device 100 in accordance with the present invention that defines when Activate commands may be accepted. Memory device 100 can accept a read or write command at time tRCD after the activate command is sent, but only one internal read may be on-going at any time. That internal read must be completed within a time defined by the tRC parameter 306, where the tRC parameter is measured from the clock signal (CK_t/CK_c) rising edge following a command/address signal (CKE, CS_n, CA0-CA9) transition edge encoding an Activate command.

In accordance with the present invention and to prevent any malfunction in memory device 100, the internal application timing prevents violating the tRC/tRCD parameter. Accordingly, Activate commands 302, 312 are considered legal if at the time they were issued at least one tRC time separates the Activate commands and all Activate commands that violate this timing constraint are ignored. This ensures the execution of legal Activate command without danger or complications for the internal sensing design scheme.

This solution ensures that no internal read is interrupted once it has started, with the consequent benefit of minimizing current consumption and preventing all read reliability issues related to unexpected sense amplifiers read phases. Also, the present invention prevents unexpected relations between synchronous command cycles and asynchronous signals driving analog circuitry like the sense amplifiers.

By now it should be apparent that embodiments of the present invention allow an Activate command to start and all following Activate commands are ignored until a time tRC has elapsed. This ensures that all illegal read requests are filtered out until the current Activate command has completed. This solution adds flexibility because it allows the user to issue illegal Activate commands and relies on memory device 100 to ensure that the on-going Activate command correctly completes.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A Phase-Change Memory (PCM) device to output data in a three phase address read, comprising:
   a PREACTIVE phase to provide an upper row address of a row address from a Row Address Buffer (RAB) for the PCM device, the row address being different from a bank address in the device;
   an ACTIVATE phase to combine the upper row address with a lower row address of the row address to select PCM data for a Row Data Buffer; and
   a READ phase to output the PCM data from the Row Data Buffer, where an Activate command starts and following Activate commands are ignored until a preset time has elapsed.

2. The PCM device of claim 1, wherein the preset time is a parameter measured from a clock signal rising edge that registers an ACTIVATE command on command/address signals to an internal read operation completion.

3. The PCM device of claim 1, where ignoring the following Activate commands until a preset time has elapsed ensures that no internal read is interrupted once it has started.

4. The PCM device of claim 3, where ignoring the following Activate commands until a preset time has elapsed prevents unexpected relations between synchronous command cycles and asynchronous signals.

5. The PCM device of claim 1, where only one internal read of the PCM device is on-going at any time.

6. The PCM device of claim 1, wherein the Row Address Buffer includes four buffers that each stores an upper row address.

7. A synchronous interface Phase-Change Memory (PCM), comprising:
   a row address buffer (RAB); and
   a row data buffer (RDB),
   where a three phase address read provides an upper row address of a row address from the RAB in a PREACTIVE phase, the row address being different from a bank address in the device, the upper row address is combined with a lower row address of the row address in an ACTIVATE phase, and data is output from the RDB in a READ phase, where sense amplifiers of the PCM are active for only one internal read of the PCM device at any given time and following Activate commands are ignored until a preset time has elapsed.

8. The synchronous interface PCM of claim 7, wherein the preset time is a parameter measured from a clock signal rising edge that registers an ACTIVATE command on command/address signals to an internal read operation completion.

9. The synchronous interface PCM of claim 7, where ignoring the following Activate commands until a preset time has elapsed ensures that no internal read is interrupted once it has started.

10. The synchronous interface PCM of claim 7 where Activate commands are legal if at the time they are issued at least one tRC time separates the Activate command from following Activate commands.

11. The synchronous interface PCM of claim 7 where all Activate commands that violate a preset time separation are ignored.

12. A method of reading a Phase-Change Memory (PCM) device, comprising:
   selecting one of four Row Address Buffers (RAB) in a PREACTIVE phase;
   combining an upper row address of a row address selected from the RAB with a lower row address of the row address in an ACTIVATE phase to read a row of PCM data that is stored in one of four Row Data Buffers (RDB), the row address being different from a bank address in the device; and
   outputting the row of PCM data from a selected RDB during a READ phase, where additional three phase address read cycles are ignored until a preset time has elapsed.

13. The method of reading the PCM device of claim 12, further comprising:
   activating sense amplifiers for only one internal read of the PCM device at any given time; and
   ignoring other Activate commands until the preset time has elapsed.

14. The method of reading the PCM device of claim 12, where ignoring the other Activate commands until the preset time has elapsed ensures that no internal read is interrupted.

15. A method for reading a PCM device, comprising:
   issuing an ACTIVATE command and combining an upper row address of a row address from a Row Address Buffer with a lower row address of the row address, the row address being different from a bank address in the device;
   reading data from the PCM device based on the ACTIVATE command; and
   inhibiting the PCM from activating sense amplifiers and reading data before a preset time elapses even though another ACTIVATE command is issued.

16. The method of reading the PCM device of claim 15, where ignoring the another Activate command until the preset time has elapsed ensures that no internal read is interrupted.

* * * * *